(12) United States Patent
Cheung et al.

(10) Patent No.: US 10,186,549 B1
(45) Date of Patent: Jan. 22, 2019

(54) GANG BONDING PROCESS FOR ASSEMBLING A MATRIX OF LIGHT-EMITTING ELEMENTS

(71) Applicant: ASM Technology Singapore Pte Ltd, Singapore (SG)

(72) Inventors: Yiu Ming Cheung, Hong Kong (HK); Ming Li, Hong Kong (HK); Zetao Ma, Hong Kong (HK); Kai Ming Yeung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 13 days.

(21) Appl. No.: 15/710,019

(22) Filed: Sep. 20, 2017

(51) Int. Cl.
*H01L 27/15* (2006.01)
*H01L 33/00* (2010.01)

(52) U.S. Cl.
CPC .......... *H01L 27/156* (2013.01); *H01L 33/005* (2013.01); *H01L 2933/0033* (2013.01)

(58) Field of Classification Search
CPC .................................................... H01L 21/673
See application file for complete search history.

(56) References Cited

U.S. PATENT DOCUMENTS

| | | | |
|---|---|---|---|
| 2012/0217287 A1* | 8/2012 | Kumar | B23K 1/0016 228/178 |
| 2015/0287696 A1* | 10/2015 | Ueda | H01L 24/29 438/107 |
| 2017/0084570 A1* | 3/2017 | Wickramanayaka | H01L 25/50 |
| 2017/0352613 A1* | 12/2017 | Baloglu | H01L 21/4853 |
| 2018/0053751 A1* | 2/2018 | Zou | H01L 33/0079 |

\* cited by examiner

*Primary Examiner* — Mounir S Amer
(74) *Attorney, Agent, or Firm* — Ostrolenk Faber LLP (57) ABSTRACT

A method for bonding a matrix of light-emitting elements onto a substrate includes forming conductive material on bond pads of the substrate in a matrix arrangement. Separately, a plurality of light-emitting elements is also picked up and placed onto a temporary carrier in the said matrix arrangement. The temporary carrier containing the plurality of light-emitting elements is then held with a bond head, and is moved by the bond head to establish contact between electrodes on the plurality of light-emitting elements and the conductive material on the substrate. When heat is applied to the light-emitting elements while exerting a compressive force with the bond head against the conductive material, conductive joints are formed between the light-emitting elements and the substrate.

20 Claims, 6 Drawing Sheets

GANG BONDING PROCESS FOR ASSEMBLING A MATRIX OF LIGHT-EMITTING ELEMENTS

FIELD OF THE INVENTION

The invention relates to the bonding of a matrix of light-emitting elements onto a substrate, such as when manufacturing a display or lighting panel.

BACKGROUND AND PRIOR ART

Currently, the elementary unit of a light-emitting diode ("LED") light source or lighting pixel for a full-color LED display panel or a single color LED lighting panel is a packaged LED unit. Such packaged LED units are typically mounted onto a printed circuit board ("PCB") of the display or lighting panel by a surface-mount technology ("SMT") assembly process. During this process, solder paste is first printed onto solder pads of the PCB, and pre-packaged LED units are then individually placed onto corresponding locations on the PCB by an SMT machine. The PCB on which the individual LED packages have been populated will then be heated in a reflow oven in order to reflow the solder paste underneath the LED packages. This forms strong solder joints between the leads of the LED packages and the solder pads of the PCB.

In the aforementioned approach, the density or lighting resolution of the display or lighting panel is limited by the size of an individual packaged LED unit. The smallest possible red, green and blue ("RGB") LED pixel assembled from a packaged LED unit is about 0.5 mm by 0.5 mm and the corresponding pitch between lighting pixels is about 0.7 mm to 0.8 mm. Further reduction of the pitch between adjacent lighting pixels is thus not possible if such packaged LED units are used for assembling high density display boards in the above manner.

In order to increase the pixel density further for producing high-density display or lighting panels, an alternative process is to bond bare flip-chip LED dice directly onto bond pads of a PCB of the display or lighting panel. Flip-chip bonding processes are preferred to conventional wire-bonding processes for the realization of the joints at the interconnects of LED dice, since lighting pixel density can be increased using flip-chip bonding processes. The relevant flip-chip LED being bonded may vary in size from 3 mils by 5 mils (75 microns×125 microns) to 6 mils by 10 mils (150 microns×250 microns), and the thickness thereof may be about 3-6 mils (75-150 microns).

Figure 1:
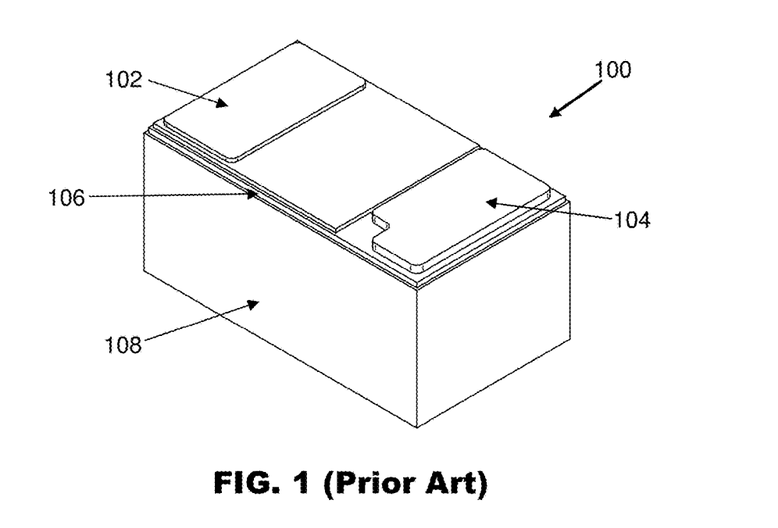
FIG. 1 is an isometric view of a typical flip-chip LED.

FIG. 1 is an isometric view of a typical flip-chip LED 100, showing its geometry and configuration. The flip-chip LED 100 has a pair of bond pads that act as electrodes, namely a p-electrode bond pad 102 and an n-electrode bond pad 104. Supplying current through these electrode bond pads 102, 104 will result in light being emitted from an active light emission layer 106 of the flip-chip LED 100. The p-electrode bond pad 102, n-electrode bond pad 104 and active light emission layer 106 are supported on a substrate 108, which may be made from sapphire, gallium arsenide, or other suitable materials.

Figure 2:
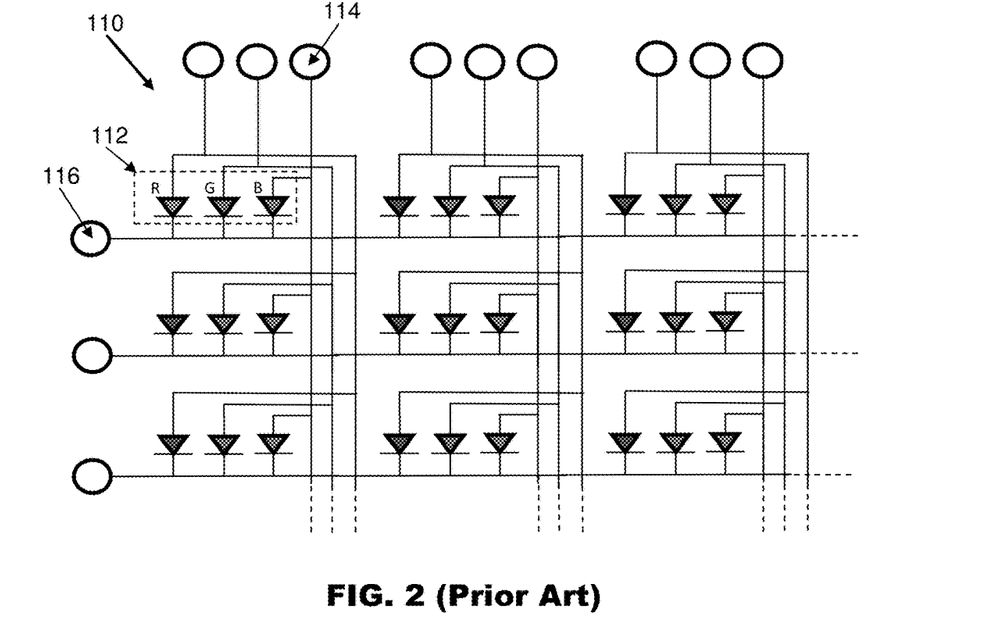
FIG. 2 is a schematic electrical circuit diagram illustrating a layout of a typical RGB display board.

FIG. 2 is a schematic electrical circuit diagram 110 illustrating a layout of a typical RGB display board, which may be in the form of a PCB. Such PCBs are fabricated in accordance with a required RGB display board format, and the bond pads on the PCB are configured for receiving the p-electrode bond pads 102 and n-electrode bond pads 104 of the flip-chip LED 100. In FIG. 2, each pixel comprises an RGB set 112 including respective red, green and blue flip-chip LEDs 100. In respect of each flip-chip LED 100, a p-electrode bond pad 102 is electrically connected to a first voltage 114 and an n-electrode bond pad 104 is electrically connected to a second voltage 116. The first voltage 114 is connected to a current source voltage control switching pin of a matrix LED driver circuit. The second voltage 116 is connected to a current sink voltage control switching pin of the matrix LED driver circuit.

For flip-chip LEDs 100 having dimensions of less than 75 microns by 75 microns (3 mils by 3 mils), conventional pick-and-place equipment may be unsuitable for transferring them, and special equipment is needed for the relevant die sorting processes and to mount them onto PCBs during die-attach processes.

The electrodes 102, 104 of the flip-chip LED 100 are typically coated with a layer of gold, wherein a nickel layer may be used as a buffer and barrier layer underneath the said layer of gold. The bonding materials for making the joints between the electrodes of the flip-chip LED and the bond pads of the circuitry on the printed circuit board may comprise: (i) gold bumps or studs, (ii) gold-tin eutectic solder material, (iii) conductive adhesive in the form of epoxy or adhesive paste (such as silver adhesive paste), or (iv) lead-free solder or solder paste such as Sn—Ag—Cu (SAC) solder.

Based on the bonding materials being used, various bonding techniques can be used for bonding the flip-chip LED onto the PCB. For instance, a direct chip-on-board bonding process for flip-chip LED can be realized by thermosonic flip-chip bonding.

In terms of a thermosonic flip-chip bonding process, flip-chip LEDs 100 having gold bumps or studs are individually bonded onto bond pads with nickel-gold (Ni/Au) metallization on a rigid PCB substrate one at a time at elevated temperatures under compression and ultrasonic actuation of the bond head for a given bond time as dictated by such thermosonic flip-chip bonding process. There are high quality requirements in terms of hardness and the prevention of organic or inorganic contamination of the surface finishes of the bond pads on the PCB, on which metallic bonds between the bond pads and the gold bumps or stud are formed under the thermosonic actuation.

Since each flip-chip LED 100 is bonded individually onto the bond pads of the PCB with the utilization of a specific bonding profile, the time taken to complete the bonding of all the flip-chip LEDs required in a modern high-resolution display or lighting panel would be very long and throughput is extremely limited.

SUMMARY OF THE INVENTION

It is thus an object of the invention to seek to provide a method of bonding a matrix of light-emitting elements having a high density which is faster and achieves higher throughput as compared to the aforesaid prior art.

Accordingly, the invention provides a method for bonding a matrix of light-emitting elements onto a substrate, comprising the steps of: forming conductive material on bond pads of the substrate in a matrix arrangement; picking and placing a plurality of light-emitting elements onto a temporary carrier in the said matrix arrangement; holding the temporary carrier containing the plurality of light-emitting elements with a bond head; moving the temporary carrier with the bond head so as to establish contact between electrodes on the plurality of light-emitting elements and the conductive material on the substrate; and thereafter applying heat to the light-emitting elements while exerting a compressive force with the bond head against the conductive material so as to form conductive joints between the light-emitting elements and the substrate.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary process for assembling a light-emitting matrix in accordance with the invention will now be described with reference to the accompanying drawings, in which.

DETAILED DESCRIPTION OF THE PREFERRED EMBODIMENT OF THE INVENTION

The present invention discloses a method for gang chip-on-board bonding of a matrix of light-emitting elements such as a flip-chip LED matrix onto a substrate, which may be in the form of a PCB for high density display/lighting panel assembly. Flexible PCBs, aluminum nitride panels and glass panels may be other forms of suitable substrates. Such gang chip-on-board bonding may use conductive material in the form of tin-based or other lead-free solder as bonding material to form the micro-joints of the interconnects between the electrodes of the flip-chip LED and the bond pads on the PCB.

The whole gang chip-on-board bonding process includes four major processing steps, namely:
(1) forming conductive material such as solder caps on bond pads of a PCB in a matrix arrangement,
(2) sorting and placing an LED matrix on a carrier in the said matrix arrangement to prepare for gang bonding,
(3) adding solder flux to the electrodes of the LED matrix, and
(4) bonding the LED matrix onto the PCB.

The details of each of the aforementioned steps are explained below.

Figure 3A:
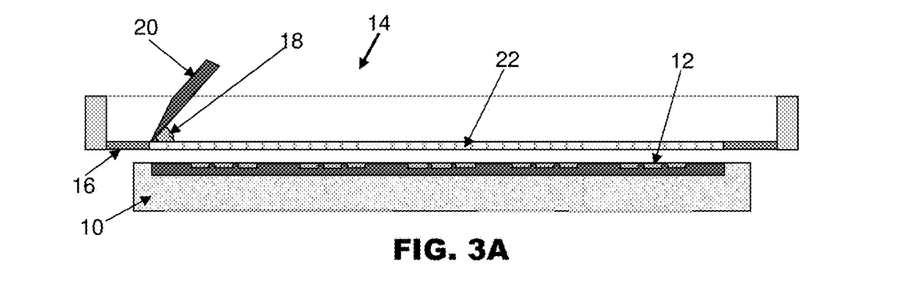
FIGS. 3A to 3C illustrate a process flow for forming solder caps on bond pads of a PCB.
Figure 3B:
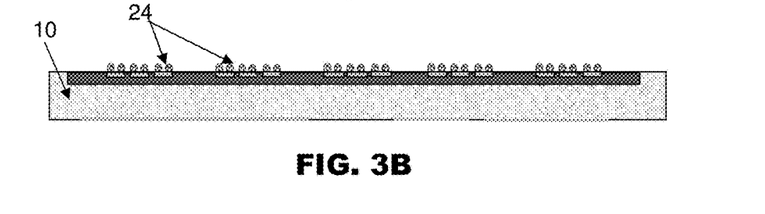
Figure 3C:
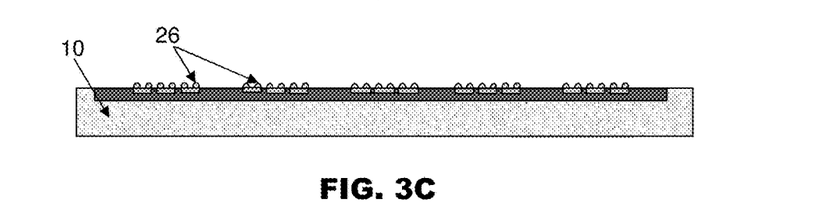

FIGS. 3A to 3C illustrate a process flow for forming solder caps 26 on bond pads 12 of a PCB 10. In FIG. 3A, the PCB 10 which has bond pads 12 on its top surface is positioned underneath a solder paste printer 14. The solder paste printer 14 includes a stencil 16 which contains solder paste 18. A squeegee blade 20 is operable to move across the stencil 16 to push the solder paste 18 across the stencil 16, and to cause solder paste 18 to pass through apertures 22 in the stencil 16 to be deposited onto bond pads 12 of the PCB 10. As such, the positions of the apertures 22 on the stencil 16 are arranged in a matrix such that they correspond to positions of the bond pads 12 which are also in a matrix arrangement.

The stencil 16 may be made from nickel, and have a thickness of about 30 microns. A size of each aperture 22 may be about 100-140 square microns at locations that correspond to locations of bond pads 12 on the PCB 10. The conductive material or solder paste 18 used may comprise type 6 solder paste (such as SAC) or other lead-free solder, which are suitable for solder printing using such small stencil apertures 22.

The solder paste 18 should preferably be mixed thoroughly before it is used so that its solder ball constituents are suspended evenly inside the solder paste 18. A squeegee blade 20, which may be made from steel, is slanted at a 60-degree angle to move at a predetermined printing speed and to apply an appropriate compressive force for this solder printing process. In addition, the solder paste printer 14 is preferably equipped with an alignment accuracy of better than +/−15 microns and has an automatic stencil cleaning module to ensure that a consistent volume of solder paste 18 is printed during each printing cycle.

FIG. 3B shows the printed solder material 24, being a mixture of solder balls and solder flux, which has been printed on the bond pads 12 of the PCB 10. Thereafter, the printed solder material 24 is reflowed by heating the PCB 10 in a standard reflow oven (not shown). After heating in the reflow oven, the reflowed printed solder material 24 forms solder caps 26 on the bond pads 12 of the PCB 10, as shown in FIG. 3C, for subsequently bonding flip-chip LEDs onto them.

In order to minimize the presence of solder voids after the solder reflow process, the PCB 10 should be pre-baked at about 120° C. for 120 minutes or more prior to printing. An optimized reflow profile should also be used to prevent overheating and to avoid a temperature ramp-up rate that is too high, which might result in aggressive solder flux evaporation and solder void formation.

The solder caps 26 on the bond pads 12 of the PCB 10 may have a thickness of 15-35 microns. Solder caps 26 within such a range of thickness provide high robustness particularly in conjunction with a thermal compression bonding process, since it can accommodate thickness variations of less than 10 microns in the flip-chip LEDs of different colors being bonded onto the PCB 10. In addition, this solder thickness would allow imperfect planarization (say, less than about 1/5000) on a bond head which is used for subsequent gang bonding.

The PCB 10 may be manufactured with copper metallization on its bond pads 12, which are coated with layers of nickel followed by gold. For the bonding of flip-chip LEDs having a size of about 125 microns by 225 microns (5 mils×9 mils), the bond pads 12 may have a size of about 140 microns by 140 microns to 160 microns by 160 microns, with a spacing of about 60-100 microns between adjacent bond pads 12.

Apart from printing solder using a solder paste printer 14, alternative techniques such as electro-plating tin onto the bond pads 12 and electroless tin plating can also be used to form tin or tin-based solder caps having a thickness of about 15-35 microns on the bond pads 12 of the PCB 10.

The next processing step is to sort and place a flip-chip LED matrix on a temporary carrier to prepare for gang bonding. FIGS. 4A to 4G illustrate a multiple-pass pick-and-place process to sort and place a flip-chip LED matrix onto a temporary carrier 30. During this process, a flip-chip LED matrix comprising the same or different colors are pre-arranged on the temporary carrier 30, so as to facilitate a subsequent bonding process.

Figure 4A:
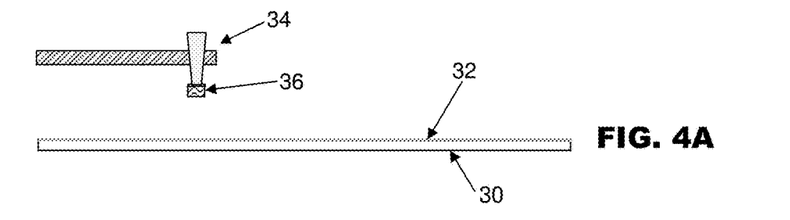
FIGS. 4A to 4G illustrate a multiple-pass pick-and-place process to sort and place a flip-chip LED matrix onto a temporary carrier.

The temporary carrier 30 is made of a rigid material with high thermal conductivity, such as aluminum nitride or silicon carbide. The temporary carrier 30 is laminated with a thin layer of adhesive 32 for fixing positions of flip-chip LEDs comprised in the flip-chip LED matrix that are mounted on the temporary carrier 30. The working temperature of this adhesive 32 should be high enough for resisting the heat generated from a temperature profile required for reflowing the solder during a bonding cycle. The adhesive 32 should also not leave residue on the flip-chip LEDs after completion of the bonding cycle. Furthermore, the adhesion strength of the adhesive 32 should be reduced when it is heated at an elevated temperature and be low enough at the elevated temperature so that the flip-chip LEDs are detachable from the adhesive 32 after solder joints of the flip-chip LED are made on the PCB 10. A silicone adhesive layer, which may also be a silicone adhesive incorporated on a polyimide base film, is an example of an adhesive 32 that may have such properties.

Figure 4B:
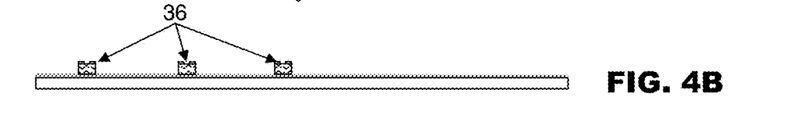
Figure 4C:
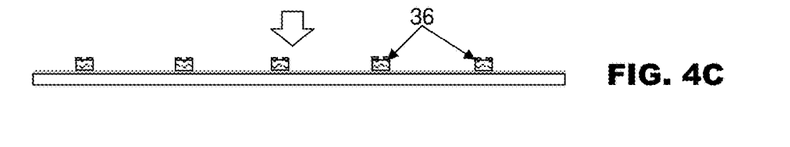

The embodiment illustrated in FIGS. 4A to 4G relates to the production of an RGB display panel. Thus, flip-chip LEDs of different colors are sorted and simply placed onto the temporary carrier 30 individually at specific locations relative to one another through multiple passes. In FIG. 4A, the sorting cycle starts with the placement of a blue LED 36, wherein the blue LED 36 has been picked from a supply of blue LEDs by a pick head 34 for placement onto the temporary carrier 30. In FIGS. 4B and 4C, further blue LEDs 36 are picked and placed by the pick head 34 onto predetermined positions on the temporary carrier 30.

Figure 4D:
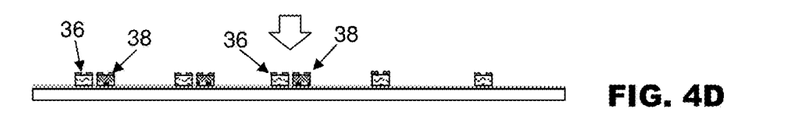
Figure 4E:
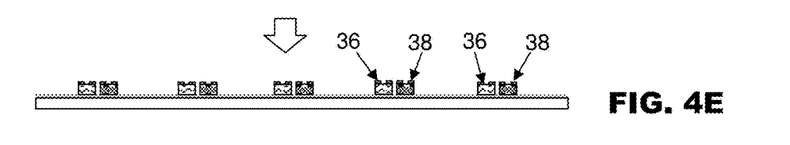
Figure 4F:
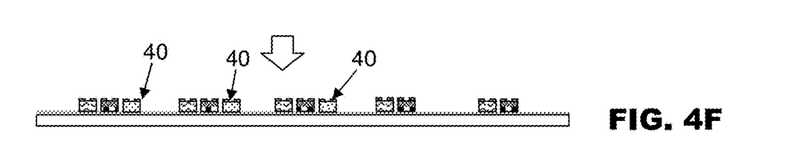

After completion of sorting of the blue LEDs 36, sorting of green LEDs 38 will commence as shown in FIG. 4D. The green LEDs 38 are placed adjacent to the blue LEDs 36 which have already been placed, until all the green LEDs 38 have been sorted and placed as illustrated in FIG. 4E. Similarly, at FIG. 4F, sorting of red LEDs 40 will begin after the completion of sorting of the green LEDs 38. The red LEDs 40 are placed adjacent to the blue LEDs 36 and the green LEDs 38, until all the sets of RGB pixels have been completed (see FIG. 4G). Such sorting and placement conducted in multiple passes can be conducted using a single machine, or using three separate connected machines which are each configured to sort one color of LEDs 36, 38, 40. Other sorting configurations are also possible.

In order to achieve accurate gang chip-on-board bonding subsequently, the aforesaid sort-and-place process can be realized by an accurate high-speed LED sorter for enhancing the speed of the process. Good flip-chip LEDs of a specific grade are picked up from the supply of sorted LEDs (such as from a wafer) based on testing and mapping previously conducted on the flip-chip LEDs. The pick head 34 will then place the flip-chip LEDs at specific locations on the temporary carrier 30.

Other than the speed of the pick-and-place process, the placement accuracy during the process is also relevant for enhancing the throughput of the subsequent gang chip-on-board bonding process. Fiducial marks are formed on the temporary carrier 30 for defining the placement locations where the flip-chip LEDs should be arranged. A pick-and place machine incorporating the pick head 34 may thus make use of vision alignment to determine the locations of the fiducial marks for placing the flip-chip LEDs accurately in the matrix arrangement. For instance, a center of the LED matrix may be defined by the fiducial marks on the temporary carrier 30. In addition, thermal compensation should be considered in relation to the placement locations of the flip-chip LEDs comprised in each RGB lighting pixel, since a coefficient of thermal expansion (CTE) of the temporary carrier 30 and the PCB 10 as well as their local temperatures during bonding are not the same. Hence, a resolution of a thermal compensation factor should be high enough to ensure that the thermally-compensated locations will result in an overall placement accuracy of the flip-chip LEDs 36, 38, 40 of within +/−20 microns from respective target bond pad 12 positions when the flip-chip LEDs are bonded on the bond pads 12 of the PCB 10.

Another consideration for the LED sorter is that a very clean environment should be provided to ensure that no sizeable foreign particles are deposited onto the temporary carrier 30 during the sorting process.

Figure 4G:
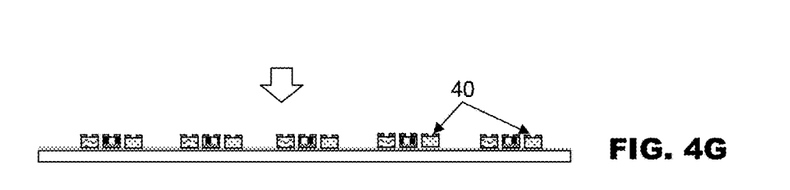

At the end of the sort-and-place process, the temporary carrier 30 which has been populated with the flip-chip LED matrix secured by the adhesive 32 will be transported to a thermal compression die bonder for conducting a gang chip-on-board bonding process. The sorted flip-chip LED matrix on the temporary carrier 30 is first flipped so that the electrodes of the flip-chip LEDs are facing downwards, and the temporary carrier 30 may be placed in a pocket of a transportable container for transportation and subsequent pick-up.

Figure 5A:
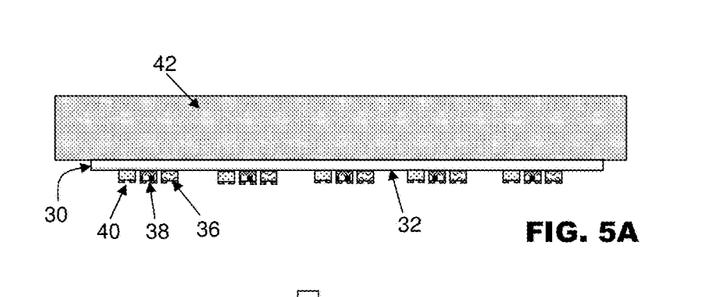
FIGS. 5A to 5D illustrate the dipping of the flip-chip LED matrix into a flux pot.
Figure 5B:
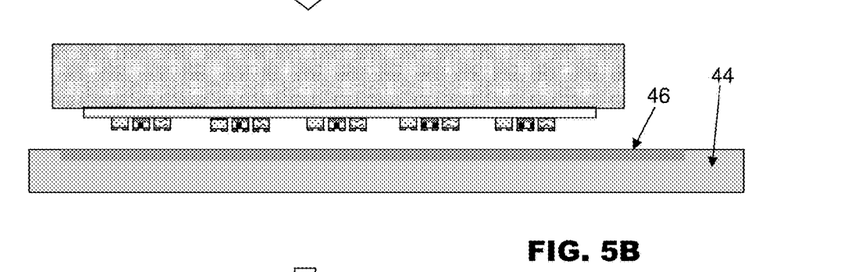
Figure 5C:
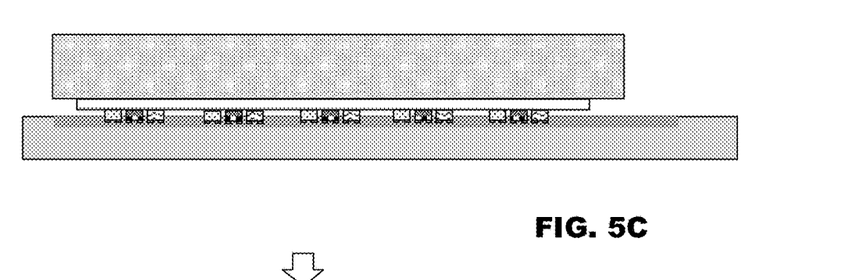

FIGS. 5A to 5D illustrate the dipping of the flip-chip LED matrix into a flux pot 44, for ensuring reliable solder joint formation during gang bonding. Before conducting actual bonding, flux should be applied to electrodes of the blue, green, and red LEDs 36, 38, 40 to ensure good wetting of the solder onto their electrodes. In FIG. 5A, the flipped temporary carrier 30 has been picked up by a bond head 42 of the thermal compression die bonder that contains a pulsed heating element, and the temporary carrier 30 is held with the flip-chip LEDs facing downwards. In FIG. 5B, the bond head 42 is positioned over the flux pot 44. The bond head 42 lowers the flip-chip LED matrix towards a flux pool 46 contained in the flux pot 44 until all the flip-chip LEDs are simultaneously dipped into a flux pool 46, and rest on the flux pot 44 with a given pressure and for a predetermined dipping delay time, as shown in FIG. 5C. During this time, the electrode bond pads 102, 104 of the flip-chip LEDs are immersed in the flux pool 46.

Figure 5D:
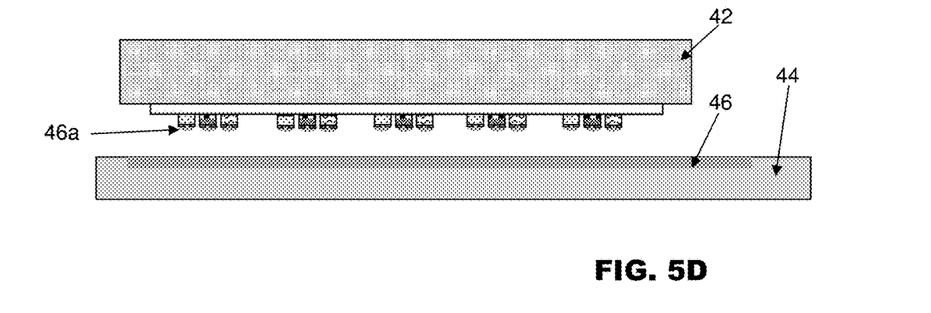

At the end of the dipping process, the flip-chip LED matrix is raised from the flux pool 46, leaving a drop of flux 46a underneath each of the electrodes of the flip-chip LEDs, as shown in FIG. 5D. The flip-chip LED matrix on the temporary carrier 30 is now ready for thermal compression bonding.

Special solder flux is preferably used for the soldering of flip-chip LEDs. For example, the flux in the flux pool 46 is water soluble and removable by rinsing with water, so that minimal or no residue remains after rinsing the flip-chip LEDs during cleaning. High-quality no-clean flux may also be used, for which only minimal residue would remain after solder reflow and there is no need for the water rinsing process.

The flux pool 46 of the flux pot 44 preferably contains flux having a certain depth, which is determined by factors such as the thickness of the flip-chip LED, the acceptable total thickness variations (TTV) of the LED matrix, and the degree of planarization between the temporary carrier 30 and the flux pot 44. Considering the above factors, the depth of the flux pool 46 may be about 45 to 55 microns.

The next processing step involves direct gang chip-on-board bonding, which is preferably realized by thermal compression bonding using a programmable force, temperature and time profile.

FIGS. 6A to 6E illustrate a process flow for gang chip-on-board bonding by means of thermal compression bonding. The PCB 10 having solder caps 26 formed on its bond pads 12 is placed onto a heated work stage (not shown), and the PCB 10 is pre-heated to a designated temperature, such as 150° C., before the PCB 10 is moved to a location under the bond head 42.

Figure 6A:
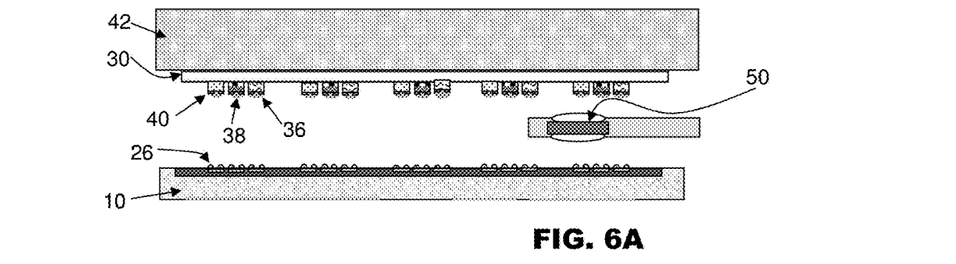
FIGS. 6A to 6E illustrate a process flow for gang chip-on-board bonding by means of thermal compression bonding.

In FIG. 6A, the flipped temporary carrier 30 which has been populated with flip-chip LEDs 36, 38, 40 having flux underneath their electrodes is held by a heated bond head 42. A vision alignment camera 50, which consists of uplooking and down-looking cameras, will move into a gap in-between the PCB 10 and the temporary carrier 30, as illustrated in FIG. 6A. In particular, the vision alignment camera 50 will move to designated locations where fiducial marks on the PCB 10 and fiducial marks on the temporary carrier 30 can be found. At these locations, the down-looking camera of the vision alignment camera 50 will search for the fiducial marks on the PCB 10 to identify the position and orientation of the PCB 10, whilst the up-looking camera of the vision alignment camera 50 will search for the fiducial marks on the temporary carrier 30 so as to identify the position and orientation of the temporary carrier 30. A work stage on which the PCB 10 is secured by vacuum suction will move and rotate if necessary so that the electrodes of each flip-chip LED in the matrix are aligned with corresponding bond pads 12 on the PCB 10.

Figure 6B:
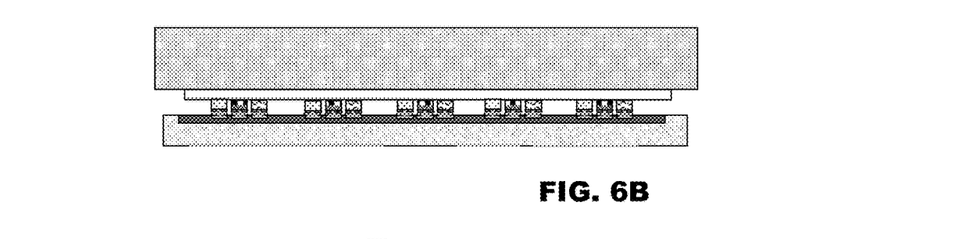

The heated bond head 42 should have good planarization with the PCB 10 on the work stage. The heated bond head 42 will then move downwards holding the temporary carrier 30 to approach the PCB 10 while raising its temperature from a stand-by temperature to a designated temperature according to the bonding profile to be used for the bonding cycle, thereby applying heat to the flip-chip LED matrix. The stand-by temperature of the bond head 42 is usually below 150° C. so as to prevent evaporation of the solder flux at this time. As illustrated by FIG. 6B, the bond head 42 will reduce its travelling speed when the electrodes of the flip-chip LED matrix are very close to the top surfaces of the solder caps 26 on the bond pads 12 of the PCB 10 (such as less than 100 microns).

Figure 6C:
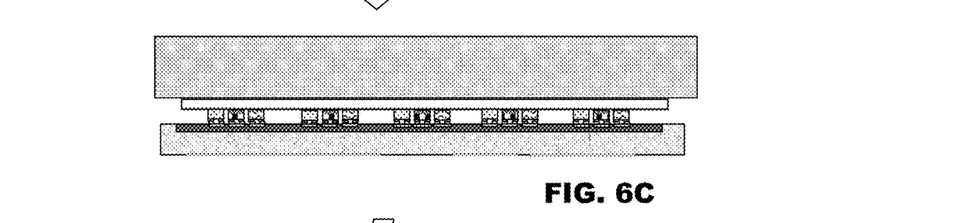

As the bond head 42 moves down further, contact will be established between the electrodes 102, 104 on the flip-chip LEDs and the solder caps 26, whereupon the flux at the tips of the electrodes of the flip-chip LEDs will wet onto the solder caps 26 on the bond pads 12. At elevated temperatures, the flux will be activated to remove any oxides that are present on the solder caps 26. The thermal compression bond head 42 will move further down so that the flip-chip LEDs will land on the solder caps 26, as shown in FIG. 6C. A very small compressive force (which is about 200-300 gf) will be applied by the bond head 42 which is sufficient to ensure there is contact between all the electrodes of the flip-chip LEDs and the solder caps 26. The bond head 42 will stay at its set bonding temperature for a given bond time, according to the adopted bonding profile.

The bond head 42 will generate a pulsed heating profile to heat up and cool down a bonding interface to induce the formation of conductive joints in the form of solder joints. The bonding profile of the bond head 42 should be such as to elevate its temperature to a designated maximum temperature which ensures that the local temperature at the bonding interface between the electrodes and solder caps 26 exceeds the liquidus temperature of solder, and the wetting of the molten solder from the solder caps 26 onto the electrodes of the flip-chip LEDs is good enough to form strong micro-joints. When the local temperature at the top surfaces of the solder caps 26 reaches the liquidus temperature of solder, the solder caps 26 will melt and wet onto the electrodes of the flip-chip LEDs. The solder caps 26 will melt starting from their top surfaces, and at the same time they will transfer heat to their surroundings. The flip-chip LEDs will move down as the solder caps 26 melt down to a level at which the resulting reaction force is balanced with the compressive force applied by the bond head 42. This compressive force ensures that all the solder caps 26 will contact their corresponding electrodes even though there may be small variations in the heights of the solder caps 26 on the bond pads 12, or if there is imperfect planarization between the PCB 10 and the temporary carrier 30.

The bond head 42 will stay at its maximum temperature and maintain its aforementioned bond level or height for a given bonding time so as to provide enough time for wetting of the solder to take place and to ensure that the molten solder on the bond pad 12 will wet onto the electrode at each location even where there may be slight spatial variations in temperature distribution across the whole bonding area underneath the bond head 42.

Figure 6D:
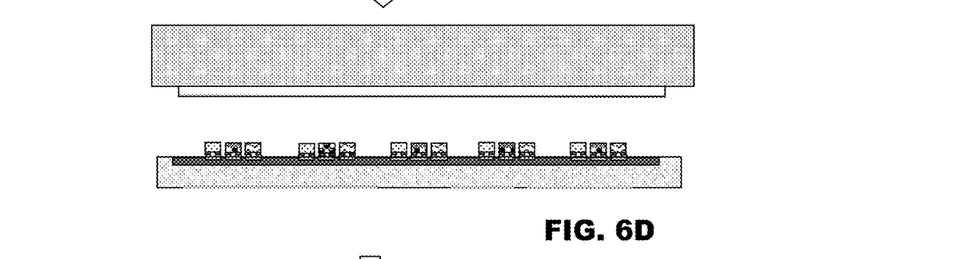

At the end of the bonding time, the bond head 42 will cool down rapidly by forced air convection. The bond head 42 will not move and will stay at the same height during cooling. The solder joints between the bond pads 12 and the electrodes of the flip-chip LEDs will be formed as the molten solder solidifies completely during such cooling until the bond head 42 reaches a temperature of below 180° C. After the solder joints are formed between flip-chip LEDs and the bond pads 12 on the PCB 10, the bond head 42 will move up away from the PCB 10, as shown in FIG. 6D. At this temperature, the adhesion strength of the adhesive 32 will be smaller than that at room temperature. This property of the adhesive 32 helps to reduce the up-lifting force required for the bond head 42 during the LED detachment process. The flip-chip LEDs on the PCB 10 will thus detach from the adhesive 32 of the temporary carrier 30 when the bond head 42 raises the temporary carrier 30 away from the PCB 10.

Figure 6E:
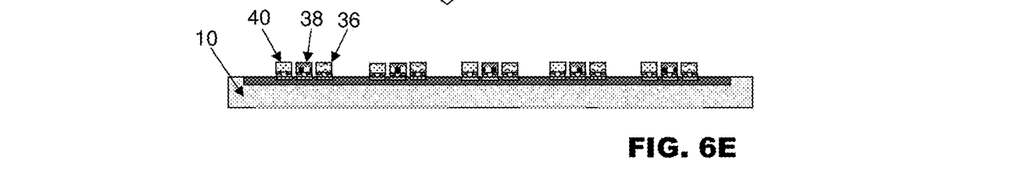

At the end of the bonding cycle, the RGB (or single color) flip-chip LEDs will be bonded onto the PCB securely as shown in FIG. 6E, and no subsequent reflow process is needed. The bonded flip-chip LEDs will stay on the PCB 10 after they have been detached from the adhesive film 32 of the temporary carrier 30. The empty temporary carrier 30 can thereafter be recycled and used for the next sorting process.

The gang chip-on-board bonding of flip-chip LEDs using thermal compression as described above results in the bonded flip-chip LEDs on the PCB 10 having negligible die tilt across all bonded flip-chip LEDs because the planarization of the temporary carrier 30 and the compression applied to the LEDs together limit the possible die tilt during the formation of solder joints, namely during solder reflow and solidification. This is one of the major advantages of the approach according to the preferred embodiment of the invention over alternative bonding process for the assembly of display/lighting panels.

Figure 7:
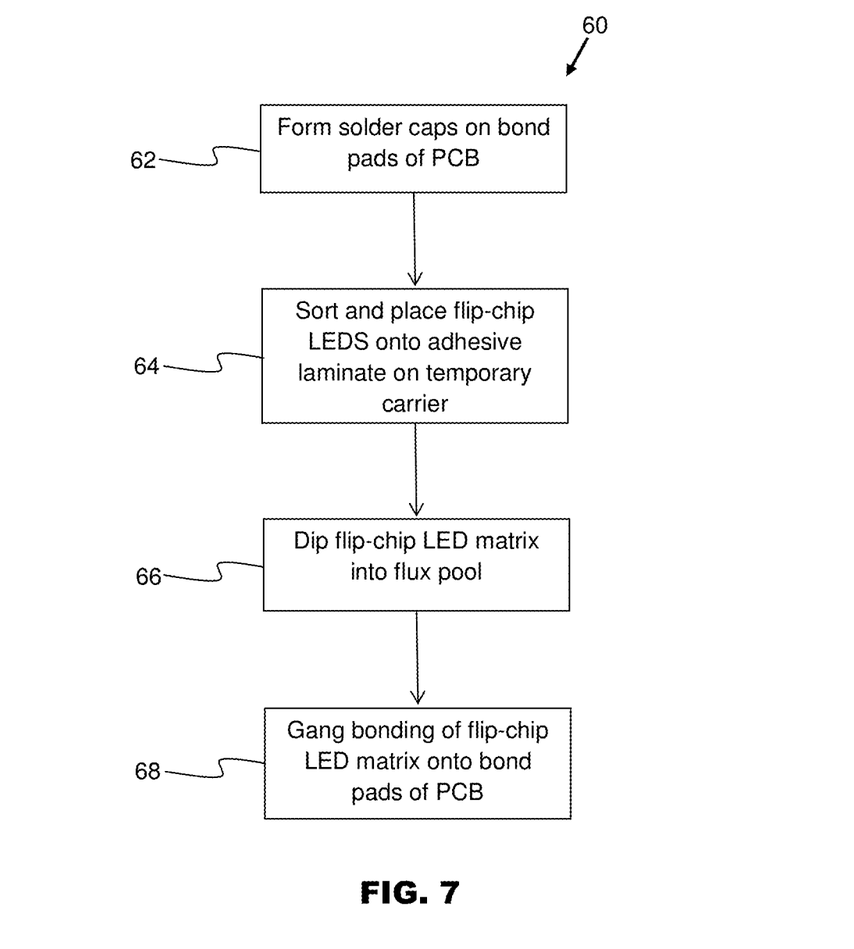
FIG. 7 is a flowchart summarizing the process flow for the gang chip-on-board bonding process according to the preferred embodiment of the invention.

FIG. 7 is a flowchart 60 summarizing the process flow for the gang chip-on-board bonding process according to the preferred embodiment of the invention. The process primarily consists of four major processing steps to enable gang chip-on-board bonding of a flip-chip LED matrix.

Solder caps 26 are first formed on bond pads 12 of the PCB 10 (step 62). Separately, the flip-chip LEDs are sorted and placed onto an adhesive 32 that is laminated onto the temporary carrier 30 in a matrix arrangement (step 64). The flip-chip LED matrix held by the temporary carrier 30 is then dipped into a flux pool 46 to form flux underneath electrodes of the flip-chip LEDs (step 66). Finally, gang thermal compression bonding is used to bond the flip-chip LED matrix onto corresponding positions on bond pads 12 on the PCB 10 (step 68).

For completing the bonding of flip-chip LEDs on a sizable PCB 10 which is larger than a size of the temporary carrier 30, repetition of the aforementioned process step 66 of dipping a further flip-chip LED matrix into the flux pool 46 and the process step 68 of gang thermal compression bonding of the further flip-chip LED matrix may be performed on further bond pads 12 of the PCB 10 at another location. Hence, the PCB 10 may be indexed to the other location after a bonding cycle for subsequently bonding flip-chip LEDs onto other parts of the PCB 10.

It should be appreciated that the preferred embodiment of the invention allows gang chip-on-board bonding of up to thousands of units of flip-chip LEDs of either the same or different colors which are arranged in matrix form to be performed at the same time. Doing so greatly increases bonding throughput as compared to conventional approaches where flip-chip LEDs are bonded individually. As such, throughput of 200,000 units per hour or more can be realized.

Although gang chip-on-board bonding of thousands of flip-chip LEDs of the same or different colors is performed at the same time, the bonding accuracy is nevertheless controllable to within +/−25 microns for each flip-chip LED that is bonded. Moreover, die tilt after bonding is controllable to within 3 degrees using the thermal compression bonding technique described above.

Another benefit is that flip-chip LEDs having a thickness variation of up to 10 microns can be arranged in the same matrix and be bonded at the same time.

Since tin-based solder or lead-free solder is used for the formation of the solder joints for the interconnects between the flip-chip LEDs and the bond pads 12 of the PCB 10, failed joints are reworkable even if failure does occur with respect to individual flip-chip LEDs. Hence, the preferred embodiment of the invention achieves a relatively low-cost solution for flip-chip LED assembly for high density single or multiple-color displays or lighting panels.

The invention described herein is susceptible to variations, modifications and/or additions other than those specifically described and it is to be understood that the invention includes all such variations, modifications and/or additions which fall within the spirit and scope of the above description.

The invention claimed is:

1. A method for bonding a matrix of light-emitting elements onto a substrate, comprising the steps of:
    forming conductive material on bond pads of the substrate in a matrix arrangement;
    picking and placing, with a pick head, a plurality of light-emitting elements onto a temporary carrier in the said matrix arrangement;
    holding the temporary carrier containing the plurality of light-emitting elements with a bond head, the bond head being separate from the temporary carrier;
    moving the temporary carrier with the bond head so as to establish contact between electrodes on the plurality of light-emitting elements and the conductive material on the substrate; and thereafter
    applying heat to the light-emitting elements while exerting a compressive force with the bond head against the conductive material so as to form conductive joints between the light-emitting elements and the substrate.

2. The method as claimed in claim 1, wherein the conductive material comprises solder.

3. The method as claimed in claim 2, wherein the step of forming solder on the bond pads includes printing the solder onto the bond pads using a solder paste printer.

4. The method as claimed in claim 2, further comprising the step of reflowing the solder to form solder caps on the bond pads of the substrate prior to establishing contact between the electrodes on the plurality of light-emitting elements and the conductive material on the substrate.

5. The method as claimed in claim 4, wherein the step of forming conductive joints comprises the formation of solder joints between the electrodes on the plurality of light-emitting elements and the solder caps.

6. The method as claimed in claim 4, wherein the solder caps have a thickness of 15-35 microns.

7. The method as claimed in claim 1, wherein the temporary carrier includes a layer of adhesive on which the light-emitting elements are mounted for fixing the positions of the mounted light-emitting elements on the temporary carrier.

8. The method as claimed in claim 7, wherein an adhesion strength of the adhesive is configured to be reduced at an elevated temperature, such that the light-emitting elements are detachable from the adhesive after the light-emitting elements are bonded onto the substrate.

9. The method as claimed in claim 7, wherein the adhesive comprises a silicone adhesive layer or a silicone adhesive incorporated onto a polyimide base film.

10. The method as claimed in claim 1, wherein the conductive material comprises tin or tin-based solder, and the conductive material on the bond pads is formed by electro-plating tin onto the bond pads or by electroless tin plating.

11. The method as claimed in claim 1, wherein the light-emitting elements are each operative to emit red, green or blue light respectively for incorporation into a display panel.

12. The method as claimed in claim 1, including fiducial marks on the substrate and on the temporary carrier for aligning the substrate with respect to the temporary carrier.

13. The method as claimed in claim 12, further comprising the step of visual alignment of the respective fiducial marks with a vision alignment camera, so as to align the substrate with respect to the temporary carrier before establishing contact between the electrodes of the light-emitting elements and the conductive material on the substrate.

14. The method as claimed in claim 1, further comprising the step of dipping the electrodes of the light-emitting elements into a flux pool for simultaneously wetting the electrodes of the light-emitting elements with flux.

15. The method as claimed in claim 14, wherein the flux is a high-quality no-clean flux which leaves minimal residue after solder reflow, or is water-soluble so that it is removable by rinsing the light-emitting elements with water.

16. The method as claimed in claim 1, including the exertion of a sufficient compressive force against the conductive material to ensure that all the conductive material will contact corresponding electrodes on the plurality of light-emitting elements.

17. The method as claimed in claim 1, wherein the bond head is comprised in a thermal compression bonder and contains a pulsed heating element.

18. The method as claimed in claim 1, further comprising the steps of establishing contact between electrodes of a further plurality of light-emitting elements and conductive material on further bond pads of the substrate and forming conductive joints therebetween, in order to bond the further plurality of light-emitting elements mounted on a temporary carrier onto another part of the substrate.

19. A method for bonding a matrix of light-emitting elements onto a substrate, comprising the steps of:
    forming conductive material on bond pads of the substrate in a matrix arrangement;
    picking and placing a plurality of light-emitting elements onto a temporary carrier in the said matrix arrangement;
    holding the temporary carrier containing the plurality of light-emitting elements with a bond head;
    moving the temporary carrier with the bond head so as to establish contact between electrodes on the plurality of light-emitting elements and the conductive material on the substrate; and thereafter
    applying heat to the light-emitting elements while exerting a compressive force with the bond head against the conductive material so as to form conductive joints between the light-emitting elements and the substrate,
    wherein the light-emitting elements are each operative to emit red, green or blue light respectively for incorporation into a display panel; and
    wherein the step of picking and placing the light-emitting elements further comprises the step of sorting the light-emitting elements that are operative to emit red, green or blue light respectively, before placing the sorted light-emitting element onto the temporary carrier at a specific location relative to another light-emitting element.

20. A method for bonding a matrix of light-emitting elements onto a substrate, comprising the steps of:
    forming conductive material on bond pads of the substrate in a matrix arrangement;
    picking and placing a plurality of light-emitting elements onto a temporary carrier in the said matrix arrangement;
    holding the temporary carrier containing the plurality of light-emitting elements with a bond head;
    moving the temporary carrier with the bond head so as to establish contact between electrodes on the plurality of light-emitting elements and the conductive material on the substrate; and thereafter
    applying heat to the light-emitting elements while exerting a compressive force with the bond head against the conductive material so as to form conductive joints between the light-emitting elements and the substrate; and
    including the exertion of a sufficient compressive force against the conductive material to ensure that all the conductive material will contact corresponding electrodes on the plurality of light-emitting elements,
    wherein the bond head is maintained at a same height while exerting the compressive force against the conductive material until the conductive material wet onto the electrodes of all the plurality of light-emitting elements, and during cooling for the formation of conductive joints.

\* \* \* \* \*